United States Patent
Bengtsson et al.

[11] Patent Number: 6,157,196
[45] Date of Patent: Dec. 5, 2000

[54] METHOD FOR MONITORING OF TAP CHANGERS BY ACOUSTIC ANALYSIS

[75] Inventors: Tord Bengtsson; Håkan Kols, both of Västerås; Lars Martinsson, Ludvika, all of Sweden

[73] Assignee: ABB Research Ltd., Vasterås, Sweden

[21] Appl. No.: 09/142,379

[22] PCT Filed: Mar. 10, 1997

[86] PCT No.: PCT/SE97/00402

§ 371 Date: Nov. 12, 1998

§ 102(e) Date: Nov. 12, 1998

[87] PCT Pub. No.: WO97/34161

PCT Pub. Date: Sep. 18, 1997

[30] Foreign Application Priority Data

Mar. 11, 1996 [SE] Sweden ................................. 9600932

[51] Int. Cl.$^7$ ......................... G01R 31/327; G01R 13/34
[52] U.S. Cl. ....................... 324/420; 324/76.38
[58] Field of Search .................... 324/536, 547, 324/127, 726, 76.38, 420; 73/584, 587; 340/646, 635; 702/115, 183, 48, 76, 199; 381/56; 327/420

[56] References Cited

U.S. PATENT DOCUMENTS

| | | | |
|---|---|---|---|
| 4,011,472 | 3/1977 | Feng | 310/328 |
| 4,159,446 | 6/1979 | Darrel et al. | 324/424 |
| 4,550,603 | 11/1985 | Fukada et al. | 73/587 |
| 5,521,840 | 5/1996 | Bednar | 702/183 |
| 5,629,864 | 5/1997 | Noe et al. | 702/115 |
| 5,859,590 | 1/1999 | Otani | 340/635 |

FOREIGN PATENT DOCUMENTS

| | | |
|---|---|---|
| 6-13248 | 1/1994 | Japan . |
| WO 93/24845 | 12/1993 | WIPO . |

*Primary Examiner*—Safet Metjahic
*Assistant Examiner*—Anjan Deb
*Attorney, Agent, or Firm*—Pollock, Vande Sande & Amernick, R.L.L.P.

[57] ABSTRACT

A method for monitoring an on-load tap changer wherein the recording of sound and its conversion into a sound signal are initiated at the beginning of a connection operation of the tap changer and the sound signal is rectified, converted into a signal envelope, sampled digitally and continuously evaluated with respect to the condition of the tap changer by comparing the envelope with at least one fixed or one continuously updated reference envelope. The comparison is carried out selectively by calculating a dimensionless comparison figure $T_i$ which is based on a quantity measure and a variation measure.

8 Claims, 2 Drawing Sheets

METHOD FOR MONITORING OF TAP CHANGERS BY ACOUSTIC ANALYSIS

TECHNICAL FIELD

The present invention relates to a method for monitoring of an on-load tap changer of a power transformer or a reactor by evaluating the sound generated by the tap changer during the connection operation.

BACKGROUND OF THE INVENTION

Voltage control of power transformers and inductance control of reactors used during electric power transmission are normally carried out with the aid of an on-load tap changer which makes it possible to change between different terminals of a winding. This is to be done under loading, and for that reason the tap changer must be capable of handling both the voltage difference between the terminals and the current through the winding. To reduce the intensity of the unavoidable arcs which arise during the connection operation, usually also resistors are connected during the connection operation. Depending on the location of the power transformer or the reactor in the electric network, the number of connection operations of a tap changer during the technical life of the transformer or the reactor may amount to several hundred thousand. A tap changer has a complicated mechanical structure which, in combination with the great number of use cycles under mechanical loading, makes the tap changer one of the most exposed components of a power transformer or a reactor.

The tap changer is exposed to wear by mechanical abrasion and arcs. This can manifest itself in a slow and gradual change of the performance of the tap changer; for example, the connection time may change because of changes in the dimensions and mutual distances of components included, such as contacts and other movable parts. The change process may at a certain stage accelerate and lead to the tap changer being incapable of functioning. This may, among other things, cause costly power failures.

To prevent functional incapability of a tap changer, the tap changer is checked. One way of doing this is an inspection of the tap changer, which requires opening of the transformer/reactor. This causes a lengthy service interruption. This is therefore carried out as seldom as possible, with an ensuing risk that a significant deterioration may occur before the next inspection.

It is known to continuously monitor the temperature of components of the tap changer, where the wear leads to an increased temperature, for example in contacts which will have increased contact resistance because of carbon deposits originating from arcs in the transformer oil. An increased temperature is then a warning and alarm signal which gives cause to inspection of the tap changer. However, significant heating only occurs in some of the change processes of a tap changer, and then only after an advanced ageing process.

Another known method is to continuously monitor the power consumption of the electric motor which drives the mechanics of the tap changer. Wear processes which manifest themselves in increased friction lead to an increased power consumption during the connection operation which can then be used as a warning or alarm signal. As in the case of temperature monitoring, this monitoring is limited to only some of the possible wear processes.

The connection operation generates sound which may be analyzed with respect to changes in the tap changer. Changed distances, changed friction etc., as a consequence of wear, influence the sound from the connection operation. Japanese patent document A 6-13248 describes a technique whereby the sound from a connection operation, which is divided into a number of sound pulses related to part-processes, is analyzed with respect to time differences between the beginning of these pulses. If one or more of these time differences deviates too much from values determined in advanced, a warning or alarm signal is released. U.S. Pat. No. 4,159,446 describes a system for detecting, by analog signal processing of a signal envelope from a connection operation, incorrectly adjusted contacts by analysis of the signal envelope, preferably by a skilled person, with respect to time differences between signal peaks in the signal envelope. With the methods described in Japanese patent document A 6-13248 and in U.S. Pat No. 4,159,446, there is a risk that not all changes in the tap changer manifest themselves in changed time differences between the sound pulses and that only heavy wear results in significant changes of these time differences.

A complete analysis of all sound from a tap changer at the time of each connection requires such calculating and memory resources that it is not practically feasible.

SUMMARY OF THE INVENTION

A method according to the invention solves the problem of using the sound generated by a tap changer during the connection operation for a continuous monitoring which detects gradual slow changes and rapid changes in the sound picture, which are related to the status of the tap changer without requiring the resources which would be needed for a complete sound analysis.

When initiating a connection operation of the tap changer, a trigger signal is given which starts the recording of the sound as an electrical signal, referred to in the following as a sound signal. The sound signal is rectified, converted into a signal envelope and sampled with a relatively low sampling frequency, typically 0.1–100 kHz. The signal envelope contains the information necessary for monitoring the status of the tap changer within a data set which can be handled. The signal envelope is permanently updated and is compared both with an envelope which is continuously adapted to the sound signal and with a fixed reference envelope, which may be the envelope for the sound signal upon delivery or after an inspection of the tap changer. The comparison is made selectively at each sample point by forming a dimensionless comparison figure, which is based on quantity measure and variation measure which are related to some suitable statistical distribution. If the comparison figure, for one or more sample points, exceeds a predetermined value, this leads to alarm or warning.

The conversion of the sampled and rectified sound signal into a signal envelope preferably takes place in an analog circuit and thus requires no additional calculating capacity. The envelope generation may be mathematically simply described as adding an exponentially decreasing "tail" to each sampled and rectified mean value and then replacing the measured value by the maximum of the measured value and all the preceding "tails". The advantage of this exponential envelope compared with other weight functions, for example a running mean over a number of measured values, is that it retains the flank of steep signal changes, which is important for the characterization of the signal.

DESCRIPTION OF THE PREFERRED EMBODIMENTS

Figure 1:
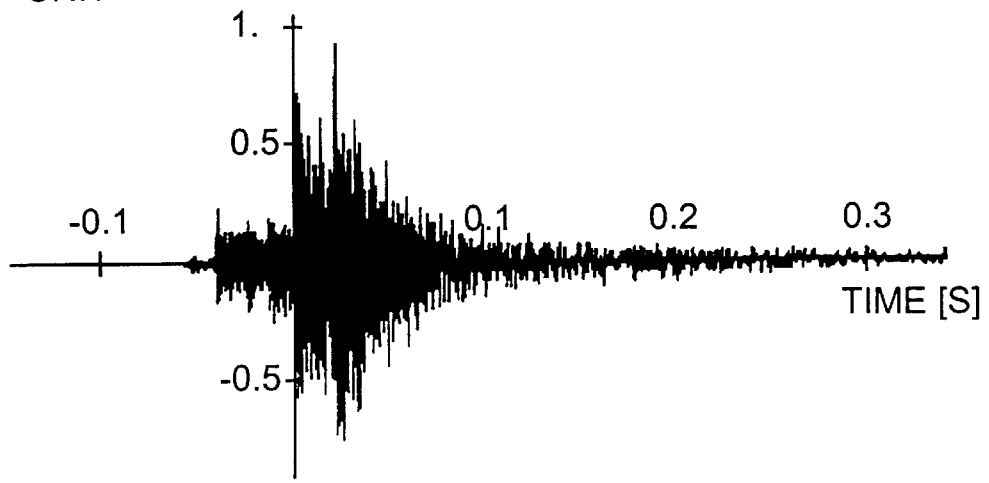
FIG. 1 shows a typical sound signal from a connection operation of an on-load tap changer.
Figure 2:
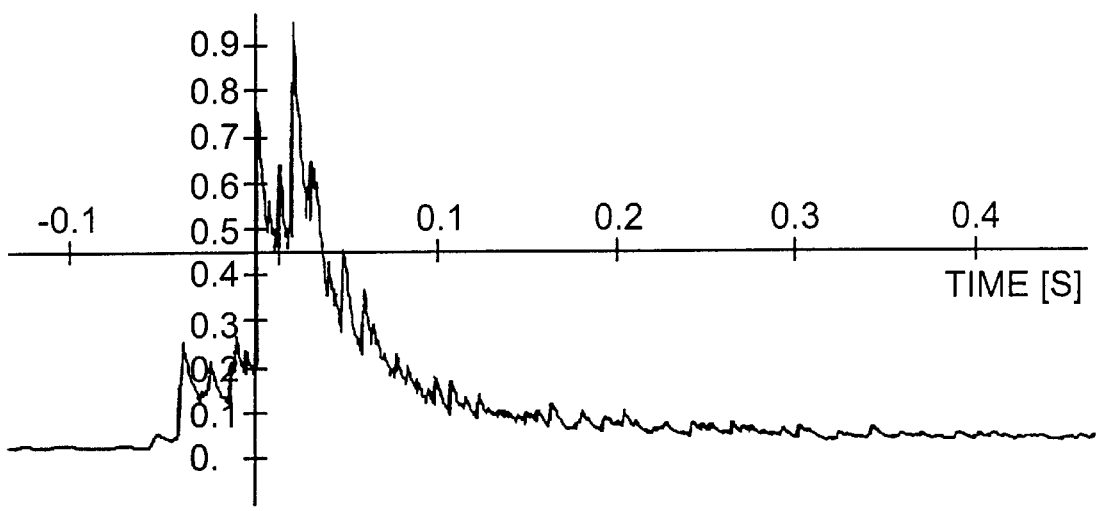
FIG. 2 shows the sound signal from FIG. 1 after rectification and envelope formation.

FIG. 1 shows a typical sound signal from a connection operation of a tap changer. It is a very unstable signal where a few major amplitude peaks can be distinguished. FIG. 2 shows the same signal after rectification and envelope formation with a 10 ms time constant of the exponentially decreasing "tail". It is seen that sudden amplitude changes in the original signal appear very clearly as upwardly moving steps of the envelope.

Figure 3:
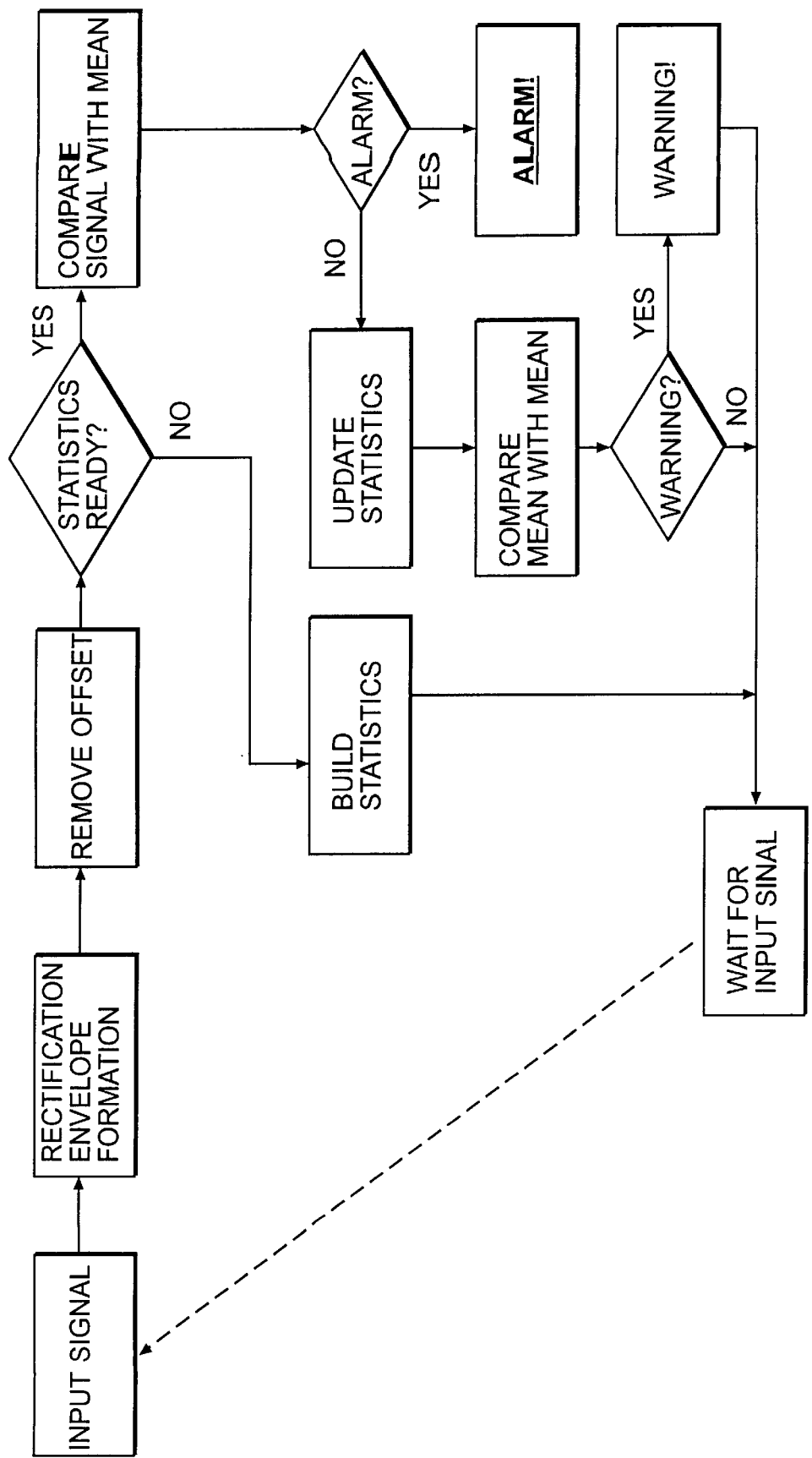
FIG. 3 shows a flow diagram for a method according to the invention.

A flow diagram for a method according to the invention is shown in FIG. 3. The first steps in the signal processing are rectification, the envelope formation already described above, and the removal of a possible offset in the signal.

For each sample number, i, of the envelope, counting from the start of the signal recording which is triggered during each connection operation, an arithmetic mean value $M_i$ and a standard deviation $s_i$ are calculated for the last $N_0$ recorded sample points with index i, where i means sample number counting from the start of the signal collection during a connection operation. $N_0$ is selected according to experience, a typical number being 10. If there are less than $N_0$ signal envelopes, statistics is built up until $N_0$ connection operations have occurred; then the calculation is advanced one step after each connection operation, and the last envelope is included and the envelope which is $N_0+1$ steps back in time is excluded. In this way, $M_i$ and $s_i$ are constantly updated and as running arithmetic mean value and standard deviation they characterize the typical appearance of the signal envelopes at the relevant time. The updating preferably occurs with a recursive algorithm which entails few calculation operations for each step. Then there is formed, for each sample point with index i, a dimensionless comparison figure $T_i=|(S_i-M_i)/s_i|$ which is the deviation of the current sample value $S_i$ with index i from the mean value $M_i$ with index i, normalized with the standard deviation $s_i$ with index i.

Instead of a standard deviation and an arithmetic mean value, which are related to the normal distribution, corresponding statistical parameters related to other distributions may be calculated to obtain a comparison figure, for example the mean value $Ml_i$ and the standard deviation $sl_i$ of the natural logarithms of the sample values, which logarithms are related to the logarithmic normal distribution. In that case, also the current sample value $S_i$ is replaced by its natural logarithm $Sl_i=\ln(S_i)$.

It is suitable to redefine $T_i$ as $T_i=\min(T_x, T_i)$, where $T_x$ is an experience value, to reduce the influence of individual extreme sample values which may relate to temporary disturbances during the measurement. Typical values for $T_x$ when using an arithmetic mean value are $T_x=5 \ldots 10$. An additional measure for reducing the influence of occasional very deviating sample values is to not choose $T_i$ directly as a comparison figure; instead the running mean value $Tm_i$ of the $N_t$ last $T_i$ is used, where $N_t$ is chosen so as to correspond to 5–10 ms.

If at least one $Tm_i$ for the current connection operation exceeds a predetermined value, for example within the range 4–5 starting from the arithmetic mean value when calculating $T_i$, an alarm signal is supplied. The signal envelope has then changed significantly during this connection operation, which is a sign that a damage may have arisen in the tap changer.

An alarm is released, as described above, at a sudden change of the sound signal envelope from a connection operation. In addition to sudden changes, for example when some structural part loosens, which results in an alarm, a gradual change of the sound signal envelope also occurs. It may be related to a corresponding gradual change of the tap changer, for example mutual distance changes through wear. Such gradual changes are detected by continuously comparing the updated mean signal envelope with a reference signal envelope, which may, for example, be taken up when putting the tap changer into service or after an inspection and any repair thereof. This is done, for example, by using the same calculations as during an alarm by replacing the sample $S_i$ of the signal envelope by a reference mean value $Mr_i$ for each index i. If at least one corresponding $Tm_i$ exceeds a predetermined value, for example the same as during an alarm, a warning signal is given, which is a sign that a significant gradual change of the status of the tap changer may have occurred.

Instead of distinguishing between alarm and not alarm and warning and not warning, respectively, both alarm and warning may be graded, depending on the magnitude of $T_i$. For example, an alarm or a warning at a highest level may provide a reason for putting the tap changer immediately out of service and immediately opening the power transformer/reactor, whereas an alarm or a warning at a lowest level becomes one indication among others for judging a suitable time for planned maintenance of the tap changer.

What is claimed is:

1. A method for monitoring an on-load tap changer, comprising:

initiating recording of sound and conversion of the sound into a sound signal at a beginning of a connection operation of the tap changer;

rectifying the sound signal;

converting the sound signal into a signal envelope;

digitally sampling the sound signal;

continuously evaluating the sound signal with respect to a condition of the tap changer by comparing the envelope with at least one fixed or one continuously updated reference envelope, wherein the comparison is selectively carried out by calculating, at each sample point with index I, a dimensionless comparison figure $T_i$ that is based on a quantity measure and a variation measure, where the quantity measure and the variation measure relate to a statistical distribution; and releasing an alarm or a warning when the comparison figure $T_i$ for one or more sample points exceeds a predetermined value.

2. The method according to claim 1, wherein the dimensionless comparison figure $T_i$ is calculated according to $T_i=|(S_i-M_i)/s_i|$, where $S_i$ is a current sample with index i, $M_i$ is a arithmetic mean value with index i and $s_i$ is the standard deviation with index i for a last $N_0$ recorded sample values.

3. The method according to claim 1, wherein the dimensionless comparison figure $T_i$ is calculated according to $T_i=|(Sl_i-Ml_i)/sl_i|$, where $Sl_i$ is the natural logarithm of a current sample with index i, $Ml_i$ is a arithmetic mean value with index i and $sl_i$ is a standard deviation with index i for logarithms of a last $N_0$ sample values.

4. A method according to claim 3, wherein the dimensionless comparison figure $T_i$ is limited by an upper limit value $T_x$ according to $T_i=\min(T_i, T_x)$.

5. The method according to claim 2, wherein in that a running mean value $Tm_i$ is formed from the last number $N_t$ of dimensional comparison figures $T_i$ and that this running mean value $Tm_i$ is used as a dimensionless comparison figure.

6. The method according to claim 5, wherein in that the number $N_t$ is chosen so as to correspond to a time between 3 and 20 milliseconds.

7. The method according to claim 2, wherein the number of $N_0$ lies between 3 and 30.

8. The method according to claim 1, wherein a sampling frequency of the signal envelope lies between 0.1 and 100 kHz.

* * * * *